US012757499B2

(12) United States Patent
Gotanda et al.

(10) Patent No.: US 12,757,499 B2
(45) Date of Patent: Oct. 6, 2026

(54) MULTILAYER JUNCTION PHOTOELECTRIC CONVERSION ELEMENT AND METHOD FOR MANUFACTURING THE SAME

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Takeshi Gotanda, Yokohama Kanagawa (JP); Tomohiro Tobari, Yokohama Kanagawa (JP); Yutaka Saita, Yokohama Kanagawa (JP)

(73) Assignee: KABUSHIKI KAISHA TOSHIBA, Kawasaki (JP)

(*) Notice: Subject to any disclaimer, the term of this patent is extended or adjusted under 35 U.S.C. 154(b) by 56 days.

(21) Appl. No.: 18/317,466

(22) Filed: May 15, 2023

(65) Prior Publication Data

US 2023/0307560 A1 Sep. 28, 2023

Related U.S. Application Data

(63) Continuation of application No. PCT/JP2020/042625, filed on Nov. 16, 2020.

(51) Int. Cl.
*H10F 10/142* (2025.01)
*H10F 71/00* (2025.01)
(Continued)

(52) U.S. Cl.
CPC ......... *H10F 10/142* (2025.01); *H10F 71/129* (2025.01); *H10F 77/219* (2025.01);
(Continued)

(58) Field of Classification Search
CPC ..... H01L 31/022475; H01L 31/022441; H01L 31/1868; H10F 10/142; H10F 71/129;
(Continued)

(56) References Cited

U.S. PATENT DOCUMENTS 10,019,361 B2 7/2018 Catthoor et al.
10,333,016 B2 6/2019 Uzu et al.
(Continued)

FOREIGN PATENT DOCUMENTS

CN 106058054 A 10/2016
JP 2013-106025 A 5/2013
(Continued)

OTHER PUBLICATIONS

German Patent and Trademark Office, Office Action in DE App. No. 11 2020 007 777.2, (Jul. 1, 2025).

*Primary Examiner* — Devina Pillay
(74) *Attorney, Agent, or Firm* — Finnegan, Henderson, Farabow, Garrett & Dunner, LLP

(57) ABSTRACT

The present embodiment provides a semiconductor element that can generate power with high efficiency and has high durability.

A multilayer junction photoelectric conversion element according to an embodiment comrises:
- a first electrode;
- a first photoactive layer including a perovskite semiconductor;
- a first passivation layer;
- a first doped layer;
- a second photoactive layer containing silicon; and
- a second electrode, in this order. The multilayer junction photoelectric conversion element further comprises a light scattering layer including a plurality of mutually separated silicon alloy layers that penetrate a part of the passivation layer and electrically connect the first pho- (Continued)

toactive layer and the first doped layer. The element can be manufactured by a method including forming a bottom cell including a second active layer and then forming a first photoactive layer by coating.

5 Claims, 1 Drawing Sheet

(51) Int. Cl.

| | |
|---|---|
| ***H10F 77/20*** | (2025.01) |
| ***H10K 30/80*** | (2023.01) |
| ***H10K 39/15*** | (2026.01) |
| ***H10K 39/18*** | (2026.01) |
| ***H10K 85/50*** | (2023.01) |

(52) U.S. Cl.
CPC .......... *H10F 77/247* (2025.01); *H10K 30/80* (2023.02); *H10K 39/15* (2023.02); *H10K 39/18* (2023.02); *H10K 85/50* (2023.02)

(58) Field of Classification Search
CPC ..... H10F 77/219; H10F 77/247; H10K 39/15; H10K 39/18; H10K 30/80; H10K 85/50
See application file for complete search history.

(56) References Cited

U.S. PATENT DOCUMENTS

| | | | |
|---|---|---|---|
| 10,672,930 B2 | 6/2020 | Mishima et al. | |
| 10,944,017 B2 | 3/2021 | Mishima et al. | |
| 11,410,818 B2 | 8/2022 | Gotanda et al. | |
| 11,462,655 B2 | 10/2022 | Ahn et al. | |
| 2011/0114171 A1* | 5/2011 | Meier | H01L 31/02168 136/258 |
| 2011/0272009 A1* | 11/2011 | Cabral, Jr. | H01L 31/18 257/E31.13 |
| 2014/0338743 A1* | 11/2014 | Son | H01L 31/02168 438/72 |
| 2018/0019361 A1 | 1/2018 | Mishima et al. | |
| 2018/0175112 A1 | 6/2018 | Robinson et al. | |

FOREIGN PATENT DOCUMENTS

| | | | | |
|---|---|---|---|---|
| JP | 2018-93168 A | | 6/2018 | |
| JP | 2019-9402 A | | 1/2019 | |
| JP | 2019-36598 A | | 3/2019 | |
| JP | 6506837 B2 | | 4/2019 | |
| JP | 2019-195111 A | | 11/2019 | |
| JP | 6650462 B2 | | 2/2020 | |
| JP | 6670377 B2 | | 3/2020 | |
| JP | 6681754 B2 | | 4/2020 | |
| JP | 7032933 B2 | | 3/2022 | |
| KR | 10-2019-0053374 A | | 5/2019 | |
| WO | WO 2010/087312 A1 | | 8/2010 | |
| WO | WO 2011/077963 A1 | | 6/2011 | |
| WO | WO 2016/158838 A1 | | 10/2016 | |
| WO | WO 2017/195722 A1 | | 11/2017 | |
| WO | WO-2019048839 A1 | * | 3/2019 | H01L 27/302 |
| WO | WO 2020/067780 A1 | | 4/2020 | |

* cited by examiner

MULTILAYER JUNCTION PHOTOELECTRIC CONVERSION ELEMENT AND METHOD FOR MANUFACTURING THE SAME

CROSS REFERENCE TO RELATED APPLICATIONS

This application is based upon and claims the benefit of priority from the prior International Patent Application PCT/JP2020/042625, filed on Nov. 16, 2020, the entire contents of which are incorporated herein by reference.

FIELD

An embodiment of the present invention relates to a semiconductor element having high efficiency, a large area, and high durability.

BACKGROUND

Conventionally, semiconductor elements such as a photoelectric conversion element and a light-emitting element have been generally manufactured by a relatively complicated method such as a chemical vapor deposition method (CVD method). However, if these semiconductor elements can be manufactured by a simpler method, for example, a coating method, a printing method, or a physical vapor deposition method (PVD method), the semiconductor elements can be easily manufactured at low cost, and thus a method for manufacturing a semiconductor element by such a method is being sought.

On the other hand, semiconductor elements made of an organic material or a combination of an organic material and an inorganic material, such as solar cells, sensors, and light-emitting elements, have been actively researched and developed. These researches aim to find an element having high photoelectric conversion efficiency. Furthermore, as an object of such researches, an element using a perovskite semiconductor has recently attracted attention because it can be manufactured by a coating method or the like, and its high efficiency can be expected.

An object of the present embodiment is to provide a semiconductor element that can generate power with high efficiency and has high durability, and a method for manufacturing the semiconductor element.

DETAILED DESCRIPTION

Embodiments will now be explained with reference to the accompanying drawings.

A multilayer junction photoelectric conversion element according to an embodiment includes:

a first electrode;

a first photoactive layer including a perovskite semiconductor;

a first passivation layer;

a first doped layer;

a second photoactive layer containing silicon; and a second electrode, in this order, wherein the multilayer junction photoelectric conversion element further includes a light scattering layer including a plurality of mutually separated silicon alloy layers that penetrate a part of the passivation layer and electrically connect the first photoactive layer and the first doped layer.

In addition, the method for manufacturing the multilayer junction photoelectric conversion element according to the embodiment includes the steps of:

(a) forming a first passivation layer on one surface of a silicon wafer constituting a second photoactive layer;

(b) forming openings in the formed first passivation layer;

(c) applying a metal paste onto the passivation layer provided with the openings;

(d) heating the silicon wafer coated with the metal paste to form silicon alloy layers and first doped layers;

(e) forming a second electrode on a back surface of the silicon wafer on which the first passivation layer is formed;

(f) forming a first photoactive layer containing perovskite on the first passivation layer by a coating method; and (g) forming a first electrode on the first photoactive layer.

In an embodiment, the photoelectric conversion element means both an element that converts light into electricity and an element that converts electricity into light, such as a solar cell and a sensor. The both elements are different in whether the active layer functions as a power generation layer or as a light emitting layer, but are the same in basic structure.

Hereinafter, constituent members of a multilayer junction photoelectric conversion element according to the embodiment will be described using a solar cell as an example, but the embodiment can also be applied to other photoelectric conversion elements having a common structure.

Figure 1:
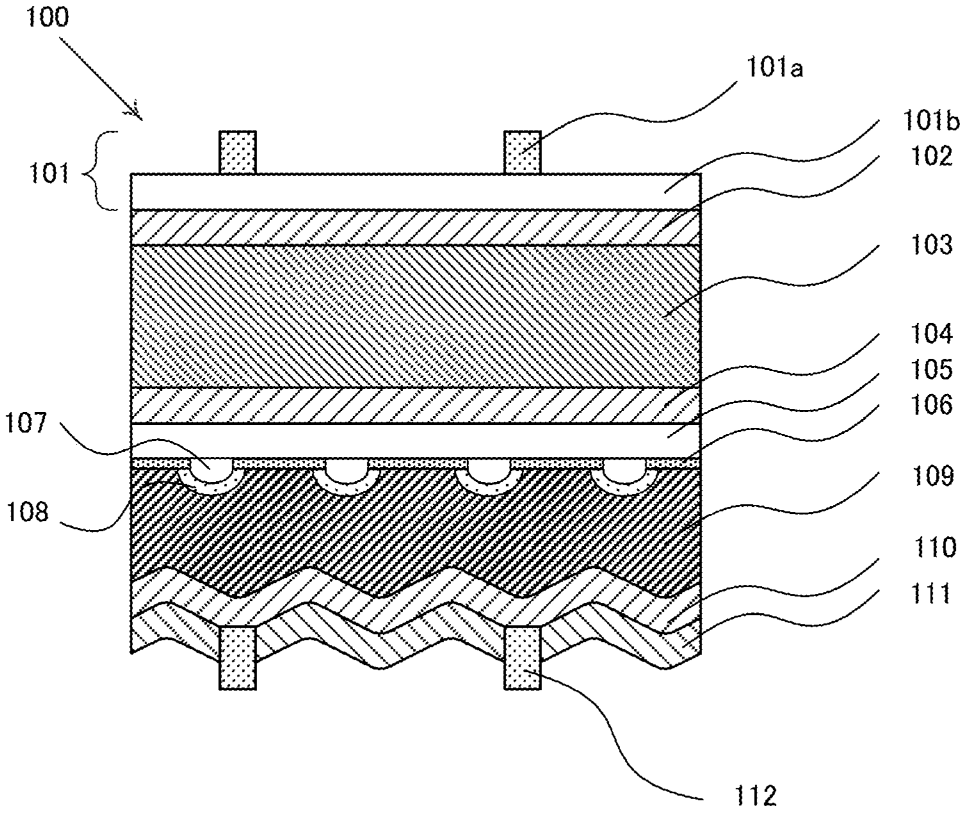
FIG. 1 is a conceptual diagram showing a structure of a multilayer junction photoelectric conversion element according to an embodiment of the present invention.

FIG. 1 is a schematic diagram showing an example of a configuration of a solar cell which is an aspect of the multilayer junction photoelectric conversion element according to an embodiment.

In FIG. 1, a first electrode 101 and a second electrode 112 serve as an anode or a cathode, and electric energy generated by the element is extracted therefrom. The photoelectric conversion element according to the embodiment includes a first photoactive layer 103 including a perovskite semiconductor, a first passivation layer 106, a first doped layer, and a second photoactive layer 109 containing silicon in this order between the first electrode 101 and the second electrode 110. The first passivation layer 106 has a plurality of openings, and the plurality of silicon alloy layers 107 penetrating the plurality of openings electrically connects the first photoactive layer 103 and the first doped layer 108.

In the multilayer junction photoelectric conversion element, the first photoactive layer 103 and the second photoactive layer 109 are layers containing a material that is excited by incident light and generates electrons or holes in the first electrode 101 and the second electrode 112. When the element according to the embodiment is a light-emitting element, each photoactive layer is a layer containing a material that generates light when electrons and holes are injected from the first electrode and the second electrode.

In addition, in the element shown in FIG. 1, a first buffer layer 102 is disposed between the first electrode and the first photoactive layer, a second buffer layer 104 and an intermediate transparent electrode 105 are disposed between the first photoactive layer 103 and the first passivation layer 106, and the second doped layer 110 and a second passivation layer 111 are disposed on the back surface of the second photoactive layer 109. The element according to the embodiment preferably includes these layers.

The element illustrated in FIG. 1 is a tandem solar cell including two photoactive layers, and having a structure in which a unit including a photoactive layer containing a perovskite semiconductor is a top cell, and a unit including a photoactive layer containing silicon is a bottom cell, and the two units are connected in series by an intermediate transparent electrode.

Hereinafter, each layer constituting the semiconductor element according to the embodiment will be described.

First Electrode

In the present embodiment, the first electrode 101 is disposed on the light incident surface side.

In FIG. 1, the first electrode 101 is a composite of a first metal electrode 101*a* and a first transparent electrode 101*b*. Since the metal electrode and the transparent electrode have different characteristics, either one of them may be used or a combination thereof may be used depending on the characteristics.

The metal electrode can be selected from any conventionally known metal electrodes as long as the metal electrode has conductivity. Specifically, a conductive material such as gold, silver, copper, platinum, aluminum, titanium, iron, or palladium can be used.

The first metal electrode can be formed by any method. For example, it can be formed by applying a paste-like composition containing a metal material onto a base material or a film and then performing a heat treatment. The metal electrode can also be formed by physical vapor deposition (PVD) using a mask pattern. Furthermore, a vacuum heating vapor deposition method, an electron beam vapor deposition method, a resistance heating vapor deposition method, or the like can be used. According to these methods, the underlying layer, for example, the perovskite semiconductor layer is less damaged than sputter deposition or the like, so that the conversion efficiency and durability of the solar cell can be improved. A screen printing method using a metal paste is also preferable. The metal paste may contain glass frit or an organic solvent. In addition, light induced plating (LIP) can be used. LIP is a method in which an electrode can be selectively formed in a portion where silicon is exposed. In this case, Ni, Ag, Cu, or the like can be used as the plating metal.

The first electrode is generally formed, after forming a laminate of the other layers, on the top of the other layers, for example, on the top of the first buffer layer. For example, it can be formed by applying a paste composition containing a metal as described above and heating the paste composition. When the treatment involving heating is performed as described above, the temperature is preferably lower than the annealing temperature of the perovskite-containing active layer described later. Specifically, it is more preferable to control the temperature of the first photoactive layer to a range of 50 to 150° C. Even in a case where a high-temperature furnace or a heat source is used for formation of the first electrode, it is possible to perform control by controlling the temperature of the element, bringing a surface different from the electrode-formed surface into contact with a stage having a cooling mechanism, or making the atmosphere vacuum. Further, this heating step can be performed simultaneously with the heating step in the formation of the second electrode described later. That is, heating in the process of manufacturing the first metal electrode and the second electrode can be performed simultaneously.

In general, the first metal electrode has a shape in which a plurality of metal wires are arranged substantially in parallel. The thickness of the first metal electrode is preferably 30 to 300 nm, and the width is preferably 10 to 1000 μm. When the thickness of the metal electrode is less than 30 nm, conductivity tends to decrease and resistance tends to increase. An increase in resistance may cause a decrease in photoelectric conversion efficiency. When the thickness of the metal electrode is 100 nm or less, the metal electrode has light transmissivity, so that power generation efficiency and light emission efficiency can be improved, which is preferable. The sheet resistance of the metal electrode is preferably as low as possible, and is preferably 10 Ω/sq. or less. The metal electrode may have a single-layer structure or a multilayer structure in which layers made of different materials are laminated.

On the other hand, when the film thickness is large, it takes a long time to form a film of the electrode, so that productivity is deteriorated, and at the same time, the temperature of other layers is increased and damaged, and the performance of the solar cell may be deteriorated.

The first transparent electrode 101*b* is a transparent or translucent conductive layer. The first electrode 101*b* may have a structure in which a plurality of materials are laminated. In addition, since the transparent electrode transmits light, the transparent electrode can be formed on the entire surface of the laminate.

Examples of the material of such a transparent electrode include a conductive metal oxide film and a translucent metal thin film. Specifically, a film (NESA or the like) produced using a conductive glass is used such as: indium oxide, zinc oxide and tin oxide; indium-soot oxide (ITO), indium-zinc-oxide (IZO), fluorine-doped tin oxide (FTO), and indium zinc-oxide, which are composites of indium oxide, zinc oxide and tin oxide; and aluminum, gold, platinum, silver, copper. In particular, metal oxides such as ITO or IZO are preferred. The transparent electrode made of such a metal oxide can be formed by a generally known method. Specifically, the transparent electrode is formed by sputtering in an atmosphere rich in a reaction gas such as oxygen.

The thickness of the first transparent electrode is preferably 30 to 300 nm when the material of the electrode is ITO. When the thickness of the electrode is less than 30 nm, conductivity tends to decrease and resistance tends to increase. An increase in resistance may cause a decrease in photoelectric conversion efficiency. On the other hand, when the thickness of the electrode is larger than 300 nm, the flexibility of the ITO film tends to decrease. As a result, in a case where the film thickness is large, cracking may occur when stress acts. The sheet resistance of the electrode is preferably as low as possible, and is preferably 10 Ω/sq. or less. The electrode may have a single-layer structure or a multilayer structure in which layers composed of materials having different work functions are laminated.

First Photoactive Layer

The first photoactive layer (photoelectric conversion layer) 103 formed by the method of the embodiment has a perovskite structure in at least a part thereof. The perovskite structure is one of crystal structures, and refers to the same crystal structure as the perovskite. Typically, the perovskite structure is composed of ions A, B, and X, and may take a perovskite structure when the ion B is smaller than the ion A. The chemical composition of this crystal structure can be represented by the following general formula (1).

$$ABX_3 \qquad (1)$$

Here, A may be a primary ammonium ion. Specific examples of A include $CH_3NH^{3+}$ (hereinafter, it may be referred to as MA), $C_2H_5NH^{3+}$, $C_3H_7NH^{3+}$, $C_4H_9NH^{3+}$, and HC $(NH_2)^{2+}$ (hereinafter, sometimes referred to as FA), and A is preferred but not limited to $CH_3NH^{3+}$. In addition, A is preferred but not limited to Cs and 1,1,1-trifluoro-ethylammonium iodide (FEAI). B is a divalent metal ion, and is preferred but not limited to $Pb^{2-}$ or $Sn^{2-}$. X is preferably a halogen ion. For example, X is selected from $F^-$, $Cl^-$, $Br^-$, $I^-$, and $At^-$, and is preferred but not limited to $Cl^-$, $Br^-$, or $I^-$. Each of the materials constituting the ions A, B, or X may be a single material or a mixture. The constituent ions can function without necessarily matching with the stoichiometric ratio of $ABX_3$.

The ion A constituting the perovskite of the first photoactive layer preferably has an atomic weight, or a total of atomic weights constituting the ions (molecular weight), of 45 or more; more preferably, contains 133 or less ions. Since the ion A under these conditions has low stability alone, a general MA (molecular weight: 32) may be mixed, but when the MA is mixed, the band gap approaches 1.1 eV of silicon, and as a tandem that improves efficiency by wavelength division, the overall characteristics deteriorate. In addition, the refractive index with respect to the optical wavelength is also affected, and the effect of the light scattering layer is reduced. Further, since MA has a small molecular weight, it is preferable to avoid MA because it is gasified to generate voids in the perovskite layer as deterioration progresses, resulting in an unintended combination of light scattering and light scattering layer. When the ion A is a combination of a plurality of ions and contains Cs, the ratio of the number of Cs to the total number of ions A is more preferably 0.1 to 0.9.

This crystal structure has a unit lattice such as a cubic crystal, a tetragonal crystal, or an orthorhombic crystal, and A is arranged at each vertex, B is arranged at the body center, and X is arranged at each face center of the cubic crystal with B as the center. In this crystal structure, an octahedron composed of one B and six X contained in the unit cell is easily distorted by interaction with A, and phase transitions to a symmetric crystal. It is presumed that this phase transition dramatically changes the physical properties of the crystal, and electrons or holes are released outside the crystal, resulting in power generation.

When the thickness of the first photoactive layer is increased, the amount of light absorption increases and the short circuit current density (Jsc) increases, but loss due to deactivation tends to increase as the carrier transport distance increases. For this reason, there is an optimum thickness in order to obtain the maximum efficiency. Specifically, the thickness of the first photoactive layer is preferably 30 to 1000 nm, and more preferably 60 to 600 nm.

For example, it is also possible to individually adjust the thickness of the first photoactive layer so that the element according to the embodiment has the same conversion efficiency as that of other general elements under the sunlight irradiation condition. However, since the type of photoactive layer is different, the element according to the embodiment can realize higher conversion efficiency than a general element under a low illuminance condition of about 200 lux.

The first photoactive layer can be formed by any method. However, it is preferable to form the first photoactive layer by a coating method from the viewpoint of cost. That is, a coating liquid containing a precursor compound having a perovskite structure and an organic solvent capable of dissolving the precursor compound is applied onto a base, for example, the first passivation layer, the intermediate transparent electrode, or the second buffer layer, to form a coating film. At this time, the surface of the base layer with which the first photoactive layer is in contact is substantially a smooth surface. That is, the interlayer interface existing between the first photoactive layer and the adjacent layer on the second photoactive layer side is a substantially smooth surface. When the base layer has such a shape, the thickness of the first photoactive layer can be made uniform, and formation of a short-circuit structure can be prevented.

As the solvent used for the coating liquid, for example, N, N-dimethylformamide (DMF), y-butyrolactone, dimethyl sulfoxide (DMSO), or the like is used. The solvent is not limited as long as it can dissolve the material, and may be mixed. The first photoactive layer can be formed by applying a single coating liquid in which all the raw materials forming the perovskite structure are dissolved in one solution. In addition, it is also possible to individually dissolve a plurality of raw materials forming the perovskite structure into a plurality of solutions to prepare a plurality of coating liquids, and sequentially apply the plurality of coating liquids. For the coating application, a spin coater, a slit coater, a bar coater, a dip coater, or the like can be used.

The coating liquid may further contain an additive. As such an additive, 1,8-diiodooctane (DIO) or N-cyclohexyl-2-pyrrolidone (CHP) is preferable.

In general, it is known that when a mesoporous structure is included in an element structure, leakage current between the electrodes is suppressed even if pinholes, cracks, voids, or the like are generated in a photoactive layer. When the element structure does not have a mesoporous structure, it is difficult to obtain such an effect. However, when the coating liquid contains a plurality of raw materials having a perovskite structure in the embodiment, volume shrinkage during active layer formation is small, so that a film having fewer pinholes, cracks, and voids is easily obtained. Further, when methyl ammonium iodide (MAI), a metal halogen compound, and/or the like coexist at the time of forming the perovskite structure, a reaction with an unreacted metal halogen compound proceeds, and a film having further fewer pinholes, cracks, and voids is easily obtained. Therefore, it is preferable to add MAI and/or the like to the coating liquid or to coat a solution containing MAI and/or the like on the coating film after coating.

The coating liquid containing the precursor of the perovskite structure may be applied twice or more. In such a case, since the active layer formed by the first coating application tends to be a lattice mismatch layer, it is preferable that the active layer is applied so as to have a relatively thin thickness. Specifically, the second and subsequent coating conditions are preferably conditions for reducing the film thickness, such as a relatively high rotation speed of the spin coater, a relatively narrow slit width of the slit coater or the bar coater, a relatively high pulling speed of the dip coater, and a relatively low solute concentration in the coating solution.

After completion of the perovskite structure forming reaction, annealing is preferably performed in order to dry the solvent. Since the annealing is performed to remove the solvent contained in the perovskite layer, it is preferable to perform the annealing before forming a next layer, for example, the buffer layer, on the first photoactive layer. The annealing temperature is 50° C. or higher, more preferably 90° C. or higher; and the upper limit is 200° C. or lower, more preferably 150° C. or lower. It should be noted that when the annealing temperature is low, the solvent may not be sufficiently removed, and when the annealing temperature is too high, the smoothness of the surface of the first photoactive layer may be lost.

When the perovskite layer is formed by coating, a surface that is not a coated surface, for example, a surface of the second electrode may be contaminated. Since the perovskite contains a halogen element having corrosiveness, it is preferable to remove contamination. The method for removing contamination is not particularly limited, but a method for causing ions to collide with the passivation layer, a laser treatment, an etching paste treatment, and solvent cleaning are preferable. The removal of contamination is preferably performed before the first electrode is formed.

First Buffer Layer and Second Buffer Layer

In FIG. 1, the first buffer layer 102 and the second buffer layer 104 are layers existing between the first electrode and the first photoactive layer or between the first photoactive layer and the tunnel insulating film, respectively. The first buffer layer 102 and the second buffer layer 104 are layers for preferentially retrieving electrons or holes. Here, when the second buffer layer exists, it serves as a base layer of the first photoactive layer, and therefore the surface thereof is preferably a substantially smooth surface.

The first buffer layer and the second buffer layer may have a laminated structure of two or more layers. For example, the first buffer layer can be a layer containing an organic semiconductor and a layer containing a metal oxide. The layer containing a metal oxide can exhibit a function of protecting the active layer when the first transparent electrode is formed. The first transparent electrode has an effect of suppressing deterioration of the first electrode. In order to sufficiently exhibit such an effect, the first transparent electrode is preferably a layer denser than the first buffer layer.

When the first buffer layer and the second buffer layer exist, one of them functions as a hole transport layer, and the other functions as an electron transport layer. In order for the semiconductor element to achieve more excellent conversion efficiency, it is preferable to include these layers, but these layers are not necessarily essential in the embodiment, and either or both of these layers may not be included.

The electron transport layer has a function of efficiently transporting electrons. When the buffer layer functions as an electron transport layer, the layer preferably contains either a halogen compound or a metal oxide. Preferable examples of the halogen compound include LiF, LiCl, LiBr, LiI, NaF, NaCl, NaBr, NaI, KF, KCl, KBr, KI, and CsF. Among them, LiF is particularly preferable.

Preferable examples of the element constituting the metal oxide include titanium, molybdenum, vanadium, zinc, nickel, lithium, potassium, cesium, aluminum, niobium, tin, and barium. A composite oxide containing a plurality of metal elements is also preferable. For example, zinc oxide doped with aluminum (AZO), titanium oxide doped with niobium, and the like are preferable. In these metal oxides, titanium oxide is more preferable. The titanium oxide is preferably amorphous titanium oxide obtained by hydrolyzing a titanium alkoxide by a sol-gel method.

In addition, an inorganic material such as metallic calcium can also be used for the electron transport layer.

An n-type semiconductor can also be used for the electron transport layer. The n-type organic semiconductor is preferred but not limited to fullerene and a derivative thereof. Specific examples thereof include derivatives having C 60, C 70, C 76, C 78, C 84, or the like as a basic skeleton. In the fullerene derivative, a carbon atom in the fullerene skeleton may be modified with an arbitrary functional group, and the functional groups may be bonded to each other to form a ring. The fullerene derivative includes fullerene-bonded polymers. The fullerene derivative is preferably a fullerene derivative having a functional group having high affinity for a solvent and having high solubility in a solvent.

Examples of the functional group in the fullerene derivative include a hydrogen atom; a hydroxy group; a halogen atom such as a fluorine atom or a chlorine atom; an alkyl group such as a methyl group or an ethyl group; an alkenyl group such as a vinyl group; a cyano group; an alkoxy group such as a methoxy group or an ethoxy group; an aromatic hydrocarbon group such as a phenyl group or a naphthyl group, an aromatic heterocyclic group such as a thienyl group or a pyridyl group, and the like. Specific examples thereof include a hydrogenated fullerene such as C60H36 and 70H36, an oxide fullerene such as C60 and C70, and a fullerene metal complex.

Among the above, it is particularly preferable to use [60] PCBM ([6,6]-phenyl C 61 butyric acid methyl ester) or [70] PCBM ([6,6]-phenyl C 71 butyric acid methyl ester) as the fullerene derivative.

In addition, as the n-type organic semiconductor, a low molecular compound that can be deposited by vapor deposition can be used. The low molecular weight compound referred to herein is one in which the number average molecular weight Mn and the weight average molecular weight Mw are the same. Any one of them is 10,000 or less. BCP (2,9-dimethyl-4,7-diphenyl-1,10-phenanthroline), Bphen (4,7-diphenyl-1,10-phenanthroline), TpPyPB (1,3,5-tri (p-pyridin-3-yl-phenyl) benzene), DPPS (diphenyl-bis (4-pyridine-3-yl) phenyl) silane) are more preferred.

When an electron transport layer is provided in the photoelectric conversion element according to the embodiment, the thickness of the electron transport layer is preferably 20 nm or less. This is because the film resistance of the electron transport layer can be lowered and the conversion efficiency can be enhanced. On the other hand, the thickness of the electron transport layer can be 5 nm or more. By providing the electron transport layer and setting the thickness thereof to a certain value or more, the hole blocking effect can be sufficiently exhibited, and it is possible to prevent the generated excitons from being deactivated before releasing electrons and holes. As a result, the current can be efficiently extracted.

The hole transport layer has a function of efficiently transporting holes. When the buffer layer functions as a hole transport layer, the layer can contain a p-type organic semiconductor material or an n-type organic semiconductor material. The p-type organic semiconductor material and the n-type organic semiconductor material mentioned herein are materials that can function as an electron donor material or an electron acceptor material when a heterojunction or a bulk heterojunction is formed.

The p-type organic semiconductor can be used as a material of the hole transport layer. The p-type organic semiconductor preferably contains, for example, a copolymer composed of a donor unit and an acceptor unit. As the donor unit, fluorene, thiophene, or the like can be used. As the acceptor unit, benzothiadiazole or the like can be used. Specifically, polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives having an aromatic amine in a side chain or a main chain, polyaniline and derivatives thereof, phthalocyanine derivatives, porphyrin and derivatives thereof, polyphenylenevinylene and derivatives thereof, polythienylenevinylene and derivatives thereof, benzodithiophene derivatives, thieno[3,2-b]thiophene derivatives, and the like can be used. For the hole transport layer, these materials may be used in combination, or a copolymer composed of a copolymer constituting these materials may be used. Among them, polythiophene and derivatives thereof are preferable because they have excellent stereoregularity and have relatively high solubility in a solvent.

In addition, as a material of the hole transport layer, a derivative such as poly[N-9'-heptadecanyl-2,7-carbazole-alto-5,5-(4',7'-di-2-thienyl-2',1',3'-benzothiadiazole)] (hereinafter, sometimes referred to as PCDTBT), which is a copolymer containing carbazole, benzothiadiazole, and thiophene, may be used. Furthermore, a copolymer of a benzodithiophene (BDT) derivative and a thieno[3,2-b]thiophene derivative is also preferable. For example, poly[[4,8-bis[(2-ethylhexyl) oxy]benzo[1,2-b: 4,5-b']dithiophene-2,6-diyl][3-fluoro-2-[(2-ethylhexyl) carbonyl]thieno[3,4-b]thiophenediyl]] (hereinafter sometimes referred to as PTB7), PTB7-Th (sometimes referred to as PCE 10, or PBDTTT-EFT) in which a thienyl group having a weaker electron donating property than the alkoxy group of PTB7 is introduced, and the like are also preferable. Furthermore, a metal oxide can also be used as a material of the hole transport layer. Preferable examples of the metal oxide include titanium oxide, molybdenum oxide, vanadium oxide, zinc oxide, nickel oxide, lithium oxide, calcium oxide, cesium oxide, and aluminum oxide. These materials have the advantage of being inexpensive. Furthermore, as the material of the hole transport layer, a thiocyanate such as copper thiocyanate may be used.

In addition, a dopant can be used for a transport material such as spiro-OMeTAD and the aforesaid p-type organic semiconductor. As the dopant, oxygen, 4-tert-butylpyridine, lithium-bis (trifluoromethanesulfonyl) imide (Li-TFSI), acetonitrile, tris[2-(1H-pyrazole-1yl) pyridine]cobalt (III) tris (hexafluorophosphate) salt (commercially available under the trade name of "FK 102"), tris[2-(1H-pyrazole-1yl) pyrimidine]cobalt (III) tris[bis (trisfluoromethylsulfonyl) imide](MY 11), or the like can be used.

As the hole transport layer, a conductive polymer compound such as polyethylene dioxythiophene can be used. As such a conductive polymer compound, those listed in the electrode section can be used. Also, in the hole transport layer, it is possible to combine another material with a polythiophene polymer such as PEDOT to adjust a material having an appropriate work function as hole transport or the like. Here, it is preferable to adjust the work function of the hole transport layer to be lower than the valence band of the active layer.

The first buffer layer is preferably an electron transport layer. Furthermore, the oxide layer is preferably an oxide layer of a metal selected from the group consisting of zinc, titanium, aluminum, tin, and tungsten. The oxide layer may be a composite oxide layer containing two or more kinds of metals. This is because the electrical conductivity is improved by the light soaking effect, and thus the power generated in the active layer can be efficiently extracted. By disposing this layer on the first electrode side of the active layer, light soaking can be performed particularly with UV light.

The first buffer layer preferably has a structure in which a plurality of layers are laminated. In such a case, it is preferable to contain an oxide of the metal described above. With such a structure, when another kind of metal oxide is newly formed by sputtering, the active layer and the metal oxide adjacent to the active layer are less likely to be damaged by sputtering.

The first buffer layer preferably has a structure including voids. More specifically, a buffer layer having a structure including a deposit of nanoparticles and having voids between the nanoparticles, a structure including a bonded body of nanoparticles and having voids between the bonded nanoparticles, and the like is preferable. When the first buffer layer includes a metal oxide film, the film functions as a barrier layer. The barrier layer is provided between the second electrode and the second buffer layer in order to suppress the corrosion of the second electrode due to the substance penetrating from another layer. On the other hand, the material constituting the perovskite layer tends to have a high vapor pressure at a high temperature. Therefore, a halogen gas, a hydrogen halide gas, and a methylammonium gas are easily generated in the perovskite layer. When these gases are confined by the barrier layer, the element may be damaged from the inside due to an increase in internal pressure. In such a case, peeling of the layer interface is particularly likely to occur. Therefore, since the second buffer layer contains voids, the increase in the internal pressure is alleviated, and high durability can be provided.

When the first electrode, that is, the metal layer is structurally isolated from the first photoactive layer by the metal oxide film, the first electrode is hardly corroded by the substance penetrating from another layer. In the present embodiment, the first photoactive layer contains a perovskite semiconductor. In general, it is known that, from a photoactive layer containing a perovskite semiconductor, halogen ions such as iodine ions or bromine ions diffuse into the element, and the component reaching the metal electrode causes corrosion. When the metal oxide film exists, it is considered that the diffusion of such a substance can be efficiently blocked. It is preferred that the metal oxide film contains indium tin oxide (ITO), fluorine-doped tin oxide (FTO), and aluminum-doped zinc oxide (AZO). The thickness of the metal oxide film is preferably 5 to 100 nm, and more preferably 10 to 70 nm. With such a structure, a metal oxide similar to the metal oxide generally used for a transparent electrode can be used, but it is preferable to use a metal oxide layer having physical properties different from those of a general metal oxide layer used for a transparent electrode. That is, it is characterized not simply by a simple constituent material, but also by its crystallinity or oxygen content. Qualitatively, the crystallinity or oxygen content of the metal oxide film contained in the first buffer layer is lower than that of a metal oxide layer formed by sputtering, which is generally used as an electrode. Specifically, the oxygen content rate is preferably 62.1 to 62.3 atom %. Whether the metal oxide film functions as a permeation preventing layer for corrosive substances can be confirmed by elemental analysis in the cross-sectional direction after the durability test. As the analysis means, time-of-flight secondary ion mass spectrometry (TOF-SIMS) or the like can be used. At least two or more peaks of the degraded substance are separately detected so as to sandwich the material exhibiting prevention of permeation of the corrosive substance, and the peak area on the first electrode side is smaller than the total area of the other peaks. When the permeation is completely prevented, the peak on the first electrode side cannot be confirmed. It is preferable that the peak on the first electrode side is so small that it cannot be confirmed, but the durability of the element is greatly improved even if the most part of the peak on the first electrode side is shielded. That is, even if a part of the first electrode is deteriorated, the characteristics such as the overall electric resistance of the first electrode are not greatly changed, so that a large change does not appear in the conversion efficiency of the solar cell. On the other hand, when the penetration is not sufficiently prevented and the first electrode and the corrosive substance react with each other, the characteristics such as the electrical resistance of the first electrode greatly change, so that the conversion efficiency of the solar cell greatly changes (the conversion efficiency decreases). Preferably, the peak area on the first electrode side is 0.007 with respect to the total area of the other peaks. The method for forming such a metal oxide film is not particularly limited, and the metal oxide film can be formed by sputtering under specific conditions.

A metal oxide film can also be formed by a coating method. In order to improve the smoothness of the interface existing between the first photoactive layer and the adjacent layer on the second photoactive layer side, it is preferable to form the film by coating.

Intermediate Transparent Electrode

The intermediate transparent electrode 105 electrically connects the top cell and the bottom cell while separating the top cell and the bottom cell from each other, and has a function of guiding light not absorbed by the top cell to the bottom cell. Therefore, the material can be selected from transparent or translucent conductive materials. Such a material can be selected from the same materials as those of the first transparent electrode.

The thickness of the intermediate transparent electrode is preferably 10 nm to 70 nm. When the thickness is less than 10 nm, there are many film defects, and isolation between layers adjacent to the intermediate transparent electrode becomes insufficient. When the thickness is larger than 70 nm, the light transmittance may cause a decrease in power generation amount of the bottom cell, for example, a silicon cell, due to a diffraction effect.

First Passivation Layer, Light Scattering Layer, and First Doped Layer

The first passivation layer 106 is disposed between the first photoactive layer 103 and the first doped layer 108 or the second photoactive layer 109. The first passivation layer electrically insulates the first photoactive layer and the second photoactive layer 109 from each other, but has an opening to secure electrical connection between the second photoactive layer and the first doped layer through the opening. Therefore, since the area where the carriers can be moved is limited, the carriers can be efficiently collected.

More specifically, the carrier recombination rate at the interface between the second photoactive layer (silicon layer) and the adjacent layer on the first photoactive layer side is as very fast as about 107 cm/s, which causes a decrease in conversion efficiency; however, by disposing the first passivation layer therebetween, the decrease in conversion efficiency can be suppressed. A dangling bond generally exists on the silicon surface, and this may also serve as a recombination center. This dangling bond can also be reduced by the first passivation layer. The thickness of the passivation layer in this case is preferably 0.1 nm to 20 nm.

The material used to form the first passivation film is preferred but not limited to a material capable of reducing the dangling bond on the silicon surface. Specific examples thereof include a silicon oxide film formed by subjecting a surface of a silicon material to a thermal oxidation treatment, and films such as AlOx and SiNx formed by plasma-enhanced chemical vapor deposition (PECVD), plasma-assisted atomic layer deposition (PEALD), and the like. When a silicon oxide film is formed by thermal oxidation, either dry oxidation in which oxidation is performed in an oxygen atmosphere or wet oxidation in which oxidation is performed in a water vapor atmosphere can be used. A wet oxide film is suitable for efficiently obtaining an oxide film having a uniform thickness. In order to obtain a good interface by thermal oxidation treatment, it is preferable to employ a high oxidation temperature of about 1000° C. On the other hand, in order to obtain a good interface in a low-temperature process, it is preferable to form a silicon nitride film (SiNx: H) by employing plasma CVD using an $NH_3/SiH_4$ gas system. The deposited film thus obtained contains a large amount of hydrogen of about $1\times10^{21}$ atoms/$cm^3$. The refractive index and the hydrogen concentration in the film can be controlled by changing the flow ratio between $NH_3$ and $SiH_4$ gas. The thickness of the first passivation film is preferably 100 nm to 100 μm.

In the element according to the embodiment, the first passivation layer is formed over the entire surface of the second photoactive layer, but in order to obtain an electrical connection between the second photoactive layer and the first photoactive layer, a part is removed to form openings. The openings can be formed by removing a part of the first passivation layer by, for example, a wet treatment. In addition, when the first passivation layer is a silicon nitride film, hydrogen contained in the silicon nitride film diffuses into silicon crystals at the time of forming an alloy layer to be described later, and crystal lattice terminals are terminated with hydrogen, so that electrical characteristics are improved.

The element according to the embodiment has the first passivation layer and the light scattering layer between the second photoactive layer and the first photoactive layer. This structure is similar to a commonly known back-passivated solar cell (PERC solar cell).

The openings and the alloy layers 107 can be formed, for example, as follows. After the first passivation layer is formed on the surface of the second photoactive layer, a part of the first passivation layer is removed using a laser or an etching paste to form the openings. A metal paste is applied to the openings and fired to form the alloy layers. The firing is preferably performed at a temperature of 600 to 1000° C. for several seconds. The metal paste preferably contains silver or aluminum. As another method, after the first passivation layer is formed on the surface of the second photoactive layer, a paste for fire through is applied to the portions where the alloy layers are to be formed, and firing is performed to react the paste with the first passivation layer, thereby forming the alloy layers. In the latter method, openings are not formed in advance, but since the first passivation layer is modified when the alloy layers are formed, the modified portions of the first passivation layer are conveniently referred to as openings in the embodiment. The metal layers formed by these methods typically have a dome-like structure.

Among these methods, a screen printing method using a metal paste containing silver or aluminum is preferable. The metal paste may further contain glass frit or an organic solvent. When a heat treatment is performed after the aluminum paste is printed, p+ layers (first doped layer) in which aluminum is diffused at a high concentration and silicon alloy layers in which aluminum and silicon are alloyed are formed. The silicon alloy layers 107 thus formed constitute the light scattering layer. The first doped layers in which aluminum is diffused at a high concentration can form a back surface electric field (BSF) and reduce carrier recombination.

Since the flow of carriers between the first photoactive layer and the first doped layer is limited by the openings, it is preferable that the areas of the individual opening and the ratio of the total area of the openings to the total area of the entire first passivation layer fall within a specific range. Specifically, the ratio of the area is preferably 50 to 95%.

When the shape of the opening is a groove shape (linear shape), the grooves are preferably arranged substantially in parallel. The width of the groove is preferably 10 to 500,000 nm, and the average interval of the grooves is preferably 10 to 5,000,000 nm. The width and the interval of the grooves may not be constant, but it is preferable to make the width and the interval substantially constant because the manufacturing is facilitated. In addition, in order to increase light absorption of the entire element, it is preferable that an average interval of the plurality of metal wires constituting the first metal electrode formed in a linear shape is shorter than an average interval of the plurality of openings formed in a groove shape in the intermediate passivation layer. As a result, a large amount of light can be taken into the solar cell, and light absorption can be maximized using the light scattering layer. When the opening has a hole shape, the shape is not particularly limited, and it is generally circular but may be an irregular shape. The area of each opening is preferably within a range of 0.01 to 40,000 $\mu m^2$.

In a tandem cell in which the top cell and the bottom cell are electrically connected in series, it is preferable to adjust the amount of light absorbed by the top cell and the bottom cell. Therefore, it is preferable that the curvature radius of the interface between the alloy layer formed on the back surface side of the element and the first doped layers is not constant. That is, the interface has a curvature radius different for each position, which is suitable for scattering light. The reflectance of the light scattering layer composed of the alloy layers is preferably 80 to 96% in the visible light region. The light scattering layer having such a reflectance can realize effective light reflection on the second photoactive layer (silicon layer) having a reflectance of 30 to 50%. Furthermore, while the silicon layer has a high refractive index of 4.2 to 3.5 in a region of a wavelength of 500 to 1500 nm, the refractive index of the light scattering layer is small, and effective light reflection can be realized also from this viewpoint. Specifically, the refractive index of the light scattering layer is preferably 1.4 to 1.8.

In the interface between the silicon alloy layer and the first doped layer, in order to enable reflection of light, it is preferable that the portion that is a plane, that is, the portion in which the curvature radius of the boundary line corresponding to the interface is infinite in a cross section is small. In general, the curvature radius of the boundary line corresponding to the interface between the silicon alloy layer and the first doped layer in a cross section parallel to the lamination direction of the first photoactive layer and the second photoactive layer is specifically preferably in a range of 1 to 100 μm and more preferably in a range of 1 to 50 μm. It is most preferable that all of the boundary lines have such a curvature radius, but some of the boundary lines may include a straight line. Specifically, with respect to the total length of the boundary line between the silicon alloy layer and the first doped layer in a cross section parallel to the lamination direction of the first photoactive layer and the second photoactive layer (the vertical direction on the paper surface of FIG. 1), the length of the portion having the curvature radius in the range of 1 to 100 μm is preferably 40% or more, and more preferably 80% or more. The boundary line can be confirmed by observing a cross-sectional sample of the element. For the cross-sectional sample, a thin sample is taken from an element by an ultrathin sectioning method (microtome method), a focused ion beam (FIB), or the like, and the taken thin sample can be measured by a transmission electron microscope (TEM), a scanning electron microscope (SEM), or the like.

In addition, the distance from the alloy layers (light scattering layer) to the second photoactive layer is preferably 100 to 400 μm. When the curvature radius of the interface has such a range, it is possible to efficiently absorb the light in which the optical path is complicatedly changed. By adopting such a configuration, it is possible to maximize the amount of current that can be taken out from the element according to the embodiment.

In addition, regarding the shape of the alloy layers, it is preferable that the portion closer to the apex has a larger curvature radius. Such a shape can be realized by increasing the removal range of the passivation layer and reducing the depth at which the alloy is formed when the alloy layers are formed.

In addition, since the carrier generation region can be further limited by reducing the thickness of the first doped layer, the amount of current to be generated can be further increased. Specifically, the thickness of the first doped layer is preferably 1 to 10 nm, and more preferably 2 to 4 nm.

Note that the first doped layer can be formed simultaneously with the alloy layer by the method described above, but the first doped layer may be manufactured by the same method and using the same material as the second doped layer described later.

Second Photoactive Layer

In FIG. 1, the second photoactive layer 109 contains silicon. A silicon having a configuration similar to that of the silicon generally used for a photovoltaic cell can be adopted as the silicon contained in the second photoactive layer. Specific examples thereof include crystalline silicon containing crystalline silicon such as monocrystalline silicon, polycrystalline silicon, and heterojunction silicon, and thin-film silicon containing amorphous silicon. The silicon may be a thin film cut out from a silicon wafer. As the silicon wafer, an n-type silicon crystal doped with phosphorus or the like and a p-type silicon crystal doped with boron or the like can also be used. The electrons in the p-type silicon crystal have a long diffusion length, and therefore are preferable. The thickness of the second photoactive layer is preferably 100 to 300 μm.

The second photoactive layer may have a uniform thickness, but a texture may be formed on one surface in order to increase the utilization efficiency of the incident light. In a general solar cell or the like, a texture may be formed on the light incident surface side, but in the embodiment, since the light incident surface of the second photoactive layer uses the light transmitted through the top cell, it is preferable to smooth the light incident surface and form a texture on the opposite side surface.

Second Doped Layer

In FIG. 1, the second doped layer 110 is a layer disposed between the second photoactive layer 109 and the second electrode 112.

As the second doped layer, depending on the characteristics of the second photoactive layer, an n-type layer, a p-type layer, a p+-type layer, a p++-type layer, and the like can be combined according to a purpose such as improving carrier collection efficiency. Specifically, when p-type silicon is used as the second photoactive layer, a phosphorus-doped silicon film (n layer) as the first doped layer can be combined with a p+ layer as the second doped layer.

The p+ layer, the p++ layer, and the like can be formed by, for example, introducing a necessary dopant into amorphous silicon (a-Si). First, silicon is deposited by a PECVD method or the like to form an a-Si layer, and a part of the a-Si layer is crystallized by an annealing treatment to form a layer having high carrier transportability. The doped amorphous silicon can also be formed by forming a film using silane and diborane or silane and phosphine as raw materials at a low temperature.

The a-Si layer can also be doped with phosphorus. The method for doping phosphorus is not particularly limited. A phosphorus-containing compound such as $POCl_3$ or $PH_3$ can be used as a dopant supply source. Phosphosilicate glass (PSG) is widely used as a phosphorus diffusion source. More specifically, PSG is deposited on a silicon substrate surface by, for example, utilizing a reaction between $POCl_3$ and oxygen, and then a heat treatment is performed at 800 to 950° C., and phosphorus can be doped into the silicon substrate by thermal diffusion. After the doping treatment, the PSG can also be removed with an acid.

Similarly, the a-Si layer can be doped with boron. The method for doping the boron is not particularly limited. A boron-containing compound such as $BBr_3$, $B_2H_6$, or BN can be used as a dopant supply source. Borosilicate glass (BSG) is widely used as a diffusion source of boron. More specifically, BSG is deposited on a substrate surface by, for example, utilizing a reaction between $BBr_3$ and oxygen, and then a heat treatment is performed at, for example, 800 to 1000° C., preferably 850 to 950° C., and boron can be doped into the silicon substrate by thermal diffusion. After the doping treatment, the BSG can be removed with an acid.

In addition, a dopant such as phosphorus or boron can be additionally doped using a laser. Such methods can also be utilized for the formation of selective emitters.

When the element according to the embodiment is considered to be distinguished into a top cell and a bottom cell, the bottom cell corresponds to a silicon solar cell. A general silicon solar cell has a textured structure on the surface, and when such a cell is adopted as a bottom cell, the thickness of a perovskite layer formed thereon becomes uneven, and a short-circuit structure is formed at a portion having a small thickness, thereby deteriorating the characteristics of the solar cell. However, if the texture structure of the surface is eliminated to form a smooth surface, light reflection on the surface decreases, the amount of light taken into the silicon layer having a large refractive index decreases, and as a result, the amount of current decreases. However, in the element according to the embodiment, the amount of light taken in can be increased by disposing the light scattering layer between the second photoactive layer and the first photoactive layer. Note that by providing a texture structure on the back surface side of the second photoactive layer as shown in FIG. 1, light scattering inside the second photoactive layer can be increased to increase the amount of light taken in.

The thickness of the second doped layer is preferably 1 to 100 nm.

Second Passivation Layer

The second passivation layer 111 is disposed on the back side of the second photoactive layer 109. For example, the second passivation layer 111 is disposed on the back surface side surface of the second photoactive layer, or the surface of the second doped layer disposed on the back surface side surface of the second photoactive layer. Similarly to the first passivation layer, the second passivation layer has a function of reducing dangling bonds of the silicon layer, and can be formed in the same manner as the first passivation layer. In addition, as a light reflecting layer, the second passivation layer also has an effect of increasing the amount of light taken in by the first and second photoactive layers. The thickness of such a second passivation layer is preferably 0.01 to 1000 μm.

Second Electrode

The second electrode 112 can be formed using any conventionally known material as long as it has conductivity. In addition, the method for forming the second electrode 112 is not particularly limited. Specifically, the second electrode 112 can be formed in the same manner as the first metal electrode described above. Further, in FIG. 1, the second electrode 112 has a plurality of electrodes disposed apart from each other on the back surface of the element, but may be formed along the entire back surface of the element. In this case, light that cannot be absorbed by the first and second photoactive layers can be reflected by the second electrode and used again for photoelectric conversion in the first and second photoactive layers.

The thickness of the second electrode is preferably 30 to 300 nm. When the thickness of the electrode is less than 30 nm, conductivity tends to decrease and resistance tends to increase. An increase in resistance may cause a decrease in photoelectric conversion efficiency. A thickness of 100 nm or less is preferable for improving power generation efficiency and light emission efficiency because even a metal has optical transparency in that thickness. The sheet resistance of the electrode is preferably as low as possible, and is preferably 10 Ω/sq. or less. The electrode may have a single-layer structure or a multilayer structure in which layers made of different materials are laminated.

When the thickness of the second electrode is thinner than the above range, the resistance becomes too large, and the generated charge may not be sufficiently transmitted to the external circuit. When the film thickness is large, it takes a long time to form the electrode, so that the temperature of the material increases, and other materials are damaged, and the performance may be deteriorated. Furthermore, since a large amount of material is used, the occupancy time of the film forming apparatus becomes long, which may lead to an increase in cost.

Antireflection Layer

In order to increase the amount of light taken in from the outside, an antireflection layer may be provided in the outermost layer of the element, that is, an interface portion with the atmosphere. Such an antireflection film can be formed using a generally known material, for example, SnNx or $MgF_2$. These materials can be deposited by a PECVD method, a vapor deposition method, or the like. When an antireflection film is provided on the outermost layer of the element, the first electrode and the second electrode need to be electrically connected to the outside in order to extract a current from the element. Therefore, it is preferable to remove a part of the antireflection film so that the antireflection film does not hinder electrical connection.

As such a removal method, a wet etching treatment method, a method using an etching paste, a method using a laser, or the like can be used.

Design of Tandem Structure

The element illustrated in FIG. 1 is a tandem solar cell including two photoactive layers, and having a structure in which a unit including a photoactive layer containing a perovskite semiconductor is a top cell, and a unit including a photoactive layer containing silicon is a bottom cell, and the two units are connected in series by an intermediate transparent electrode. In general, the band gap of a silicon solar cell is about 1.1 eV, but by combining the silicon solar with a photovoltaic cell containing a perovskite semiconductor having a relatively wide band gap, light in a wider wavelength region can be efficiently absorbed.

In general, the open circuit voltage of a silicon solar cell is 0.6 to 0.75 V, and the open circuit voltage of a perovskite solar cell is 0.9 to 1.3 V. In a tandem solar cell in which these cells are combined, by increasing the power generation amount by the perovskite solar cell, power with a higher voltage than that of the silicon solar cell alone can be obtained. That is, the output obtained by a tandem solar cell can exceed that of a silicon solar cell alone. Since the tandem solar cell is a series circuit of a top cell and a bottom cell, a voltage value close to the sum of the voltage of the top cell and the voltage of the bottom cell is obtained. On the other hand, the current is limited by the lower current of the top cell and the bottom cell. Therefore, in order to maximize the output of the tandem solar cell, it is preferable to bring the currents of the top cell and the bottom cell close to each other. In general, in order to bring the currents closer, the material of the active layer is selected to change the wavelength range of light to be absorbed, or the thickness of the photoactive layer is adjusted to change the amount of light to be absorbed. Since a silicon solar cell generally has a short circuit current density of about 40 $mA/cm^2$ alone, in a tandem solar cell, it is preferable to adjust the current density to about 20 $mA/cm^2$ for the top cell and the bottom cell.

Method for Manufacturing Element

The multilayer junction photoelectric conversion element according to the embodiment can be manufactured by laminating the above-described layers in an appropriate order. The order of lamination is not particularly limited as long as a desired structure can be obtained; for example, lamination can be performed in the following order.

A method for manufacturing a multilayer junction photoelectric conversion element includes the steps of:

(a) forming a first passivation layer on one surface of a silicon wafer constituting a second photoactive layer;
(b) forming openings in the formed first passivation layer;
(c) applying a metal paste onto the passivation layer provided with the openings;
(d) heating the silicon wafer coated with the metal paste to form silicon alloy layers and first doped layers;
(e) forming a second electrode on a back surface of the silicon wafer on which the first passivation layer is formed;
(f) forming a first photoactive layer containing perovskite on the first passivation layer by a coating method; and
(g) forming a first electrode on the first photoactive layer.

Further, the following step may be combined before the step (a).

(a0) forming a texture structure on one surface of the silicon wafer.

Furthermore, any of the following steps can be combined between the steps (d) and (e).

(d1) forming a second doped layer on a back surface of the silicon wafer on which the first passivation layer is formed, as necessary;
(d2) forming a second passivation layer on the back surface of the silicon wafer on which the first passivation layer is formed or on the second doped layer, as necessary.

Furthermore, any of the following steps can be combined between the steps (e) and (f).

(e1) forming an intermediate transparent electrode on the surface of the first passivation layer as necessary;
(e2) forming a second buffer layer on the first passivation layer or the intermediate electrode as necessary.

Furthermore, if necessary, the following step may be combined between the steps (f) and (g), (f1) forming a first buffer layer on the first photoactive layer.

In the method exemplified here, the bottom cell including the second photoactive layer is formed first, and the top cell including the first photoactive layer is formed later. According to this method, since the step (e) of heating at a high temperature is performed before the step (f), the first photoactive layer is less likely to be damaged by heat. Also, in the case of forming the first electrode by the step (g), heat is applied to the first photoactive layer. However, in the case of heating in the step (g), it is preferable to employ a temperature lower than the temperature at which heating is performed in the step (f).

Example 1

A multilayer junction photoelectric conversion element having the structure shown in FIG. 1 is manufactured. When a p-type wafer is etched using an alkaline solution, a (111) plane can be selectively left by etching a silicon crystal (100) plane. As a result, a pyramidal uneven structure (texture structure) can be formed on the surface. The opposite side surface can be planarized by polishing. As the second doped layer, an n layer can be formed by doping phosphorus on the surface on which the textured structure is formed. PSG is deposited on the substrate surface using a reaction between $POCl_3$ and oxygen, and then heat treatment is performed at 900° C., whereby phosphorus can be doped into silicon. PSG can be removed by acid treatment.

As the first passivation layer, an AlOx:H layer and a SnNx:H layer can be formed by PECVD on a surface opposite to the surface on which the second doped layer is formed. A part of the first passivation layer can be removed with a 532 nm laser. The first doped layer and the silicon alloy layer (light scattering layer) can be formed by applying an aluminum paste to the removed part by screen printing and firing the aluminum paste in an oven at 950° C. Furthermore, a silicon oxide film can be formed, as the second passivation film, on the second doped layer.

A part of the silicon oxide film can be opened by a laser, and then a part of the second passivation layer can be removed by an etching treatment. A second electrode containing silver as a main component can be formed on the exposed second doped layer by electron beam evaporation to be an electron extraction electrode.

ITO can be formed by sputtering as the intermediate transparent electrode so as to be electrically connected to the light scattering layer. The thickness can be adjusted to 20 nm.

As the second buffer layer, an alcohol dispersion of TiOx particles can be deposited by spin coating. After the film formation, annealing is performed at 150° C.

The first photoactive layer can be formed by applying a precursor solution in which a precursor of $Cs_{0.17}FA_{0.83}Pb(Br_{0.171}I_{0.83})_3$ is dissolved in a mixed solvent of DMF and DMSO (DMSO is 10 Vol %). After the film formation, annealing is performed at 150° C. for 5 minutes. The first buffer layer can be formed by spin coating with Spiro-OMeTAD in a thickness of 100 nm. Next, IZO can be formed as the first transparent electrode by sputtering. Finally, a tandem solar cell can be formed by depositing silver as the first metal electrode using a vapor deposition machine.

In a general silicon solar cell, if the surface remains a smooth surface, it is difficult to increase light absorption because the refractive index of the silicon layer is high, and the photocurrent amount decreases. However, in the element according to the embodiment, by forming the top cell having the photoactive layer including the perovskite on the bottom cell having the silicon layer, the light absorption amount can be increased, and as a result, the photocurrent amount is increased. Furthermore, since the scattering layer is formed, light that cannot be absorbed by the first and second photoactive layers or silicon can be scattered and reflected and reused for photocurrent. In addition, since the passivation layer is disposed between the first photoactive layer and the second photoactive layer, an effect of preventing carrier recombination at the electrode interface is also obtained. The amount of current can be increased by the light scattering effect and the carrier recombination preventing effect.

Figure 2:
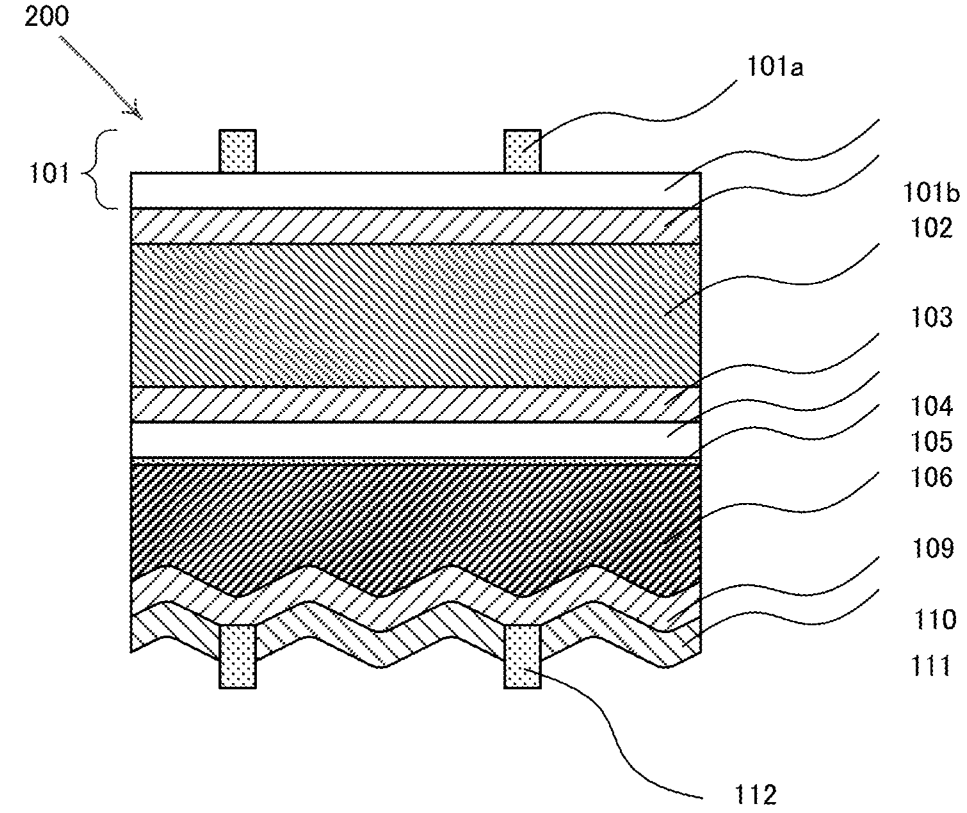
FIG. 2 is a conceptual diagram showing a structure of a multilayer junction photoelectric conversion element according to Comparative Example 1.

An element having the structure illustrated in FIG. 2 is formed. The element was prepared by the same method as in Example 1 except that the light scattering layer and the first doped layer were not formed.

In the element according to Comparative Example 1, the interface between the first photoactive layer and the second photoactive layer is smooth, but since the element has a top cell including a perovskite semiconductor, the light absorption into the second photoactive layer is relatively large. However, since there is no light scattering layer, light that cannot be absorbed by each photoactive layer is reflected by the texture structure, but is not sufficiently scattered. As a result, non-uniformity occurs in the distribution of the amount of light incident on the first and second photoactive layers. As a result, the concentration of the generated carriers becomes non-uniform, and at a place where the amount of light is high, the concentration of the generated carriers increases, the carrier recombination loss also increases, and the amount of current decreases.

REFERENCE SIGNS LIST

- 100 multilayer junction photoelectric conversion element (multilayer junction photoelectric conversion element of Example 1)
- 101 first electrode
- **101*a*** first metal electrode
- **101*b*** first transparent electrode
- 102 first buffer layer
- 103 first photoactive layer including a perovskite semiconductor
- 104 second buffer layer
- 105 intermediate transparent electrode
- 106 first passivation layer
- 107 alloy layer
- 108 first doped layer
- 109 second photoactive layer
- 110 second doped layer
- 111 second passivation layer
- 112 second electrode
- 200 multilayer junction photoelectric conversion element of Comparative Example 1

The invention claimed is:

1. A multilayer junction photoelectric conversion element comprising:

a first electrode;

a first photoactive layer including a perovskite semiconductor;

a first passivation layer;

a first doped layer;

a second photoactive layer containing silicon; and a second electrode, in this order, wherein the multilayer junction photoelectric conversion element further comprises a light scattering layer including a plurality of mutually separated silicon alloy layers that penetrate a part of the first passivation layer and electrically connect the first photoactive layer and the first doped layer, and a texture structure on the back surface side of the second photoactive layer, a curvature radius of a boundary line between the silicon alloy layer and the first doped layer in a cross section parallel to a lamination direction of the first photoactive layer and the second photoactive layer is not constant, the refractive index of the light scattering layer is 1.4 to 1.8, and a distance from a back surface of the light scattering layer to the back surface of the second photoactive layer is 100 to 400 μm.

2. The multilayer junction photoelectric conversion element according to claim 1, wherein, with respect to a total length of the boundary line, a length of a portion where the curvature radius is within a range of 1 to 100 μm is 40% or more.

3. The multilayer junction photoelectric conversion element according to claim 1, further comprising an intermediate transparent electrode between the first photoactive layer and the light scattering layer.

4. The multilayer junction photoelectric conversion element according to claim 1, wherein an interface existing between the first photoactive layer and an adjacent layer on a second photoactive layer side is a substantially smooth surface.

5. The multilayer junction photoelectric conversion element according to claim 1, wherein the first electrode includes a first metal electrode layer in which a plurality of metal wires are arranged substantially in parallel, the light scattering layer includes the plurality of silicon alloy layers that are arranged substantially in parallel, and an average interval between the plurality of metal wires is narrower than an average interval between the plurality of silicon alloy layers.

* * * * *